(12) United States Patent
Liu et al.

(10) Patent No.: US 9,202,892 B2
(45) Date of Patent: Dec. 1, 2015

(54) MANUFACTURING METHOD OF TFT ARRAY SUBSTRATE

(71) Applicant: BOE TECHNOLOGY GROUP CO., LTD., Beijing (CN)

(72) Inventors: Xiang Liu, Beijing (CN); Jianshe Xue, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 0 days.

(21) Appl. No.: 13/980,202

(22) PCT Filed: Dec. 10, 2012

(86) PCT No.: PCT/CN2012/086312
§ 371 (c)(1),
(2) Date: Jul. 17, 2013

(87) PCT Pub. No.: WO2013/104228
PCT Pub. Date: Jul. 18, 2013

(65) Prior Publication Data
US 2013/0302939 A1    Nov. 14, 2013

(30) Foreign Application Priority Data
Jan. 13, 2012   (CN) .......................... 2012 1 0010351

(51) Int. Cl.
*H01L 29/66* (2006.01)
*H01L 29/786* (2006.01)
*H01L 27/12* (2006.01)

(52) U.S. Cl.
CPC ...... *H01L 29/66742* (2013.01); *H01L 27/1225* (2013.01); *H01L 27/1288* (2013.01); *H01L 29/66969* (2013.01); *H01L 29/7869* (2013.01); *H01L 29/78693* (2013.01)

(58) Field of Classification Search
CPC .................. H01L 29/66742; H01L 29/78693; H01L 27/1288; H01L 27/1225; H01L 21/0274; H01L 29/7869
USPC .......................................................... 438/104
See application file for complete search history.

(56) References Cited

U.S. PATENT DOCUMENTS

| 2009/0173893 | A1* | 7/2009 | Tanaka et al. ............... 250/492.2 |
| 2010/0134735 | A1* | 6/2010 | Nakamura et al. ............ 349/116 |

(Continued)

FOREIGN PATENT DOCUMENTS

| CN | 101770121 A | 7/2010 |
| CN | 101770124 A | 7/2010 |

(Continued)

OTHER PUBLICATIONS

International Search Report mailed Mar. 14, 2013.

(Continued)

*Primary Examiner* — Peter Bradford
(74) *Attorney, Agent, or Firm* — Ladas & Parry LLP (57) ABSTRACT

A manufacturing method of a TFT array substrate is provided. The method includes the following steps: respectively forming a metal oxide semiconductor layer, an etching barrier layer, a source electrode, a data line, a drain electrode, a pixel electrode, a gate insulating layer, a contact hole, a gate electrode and a gate scanning line on a substrate by patterning processes, wherein the metal oxide semiconductor layer and the etching barrier layer are formed by a same patterning process, and the source electrode, the drain electrode, the pixel electrode and the data line are formed by another same patterning process.

10 Claims, 6 Drawing Sheets

(56) References Cited

U.S. PATENT DOCUMENTS

| | | |
|---|---|---|
| 2010/0165227 A1 | 7/2010 | Liu et al. |
| 2010/0244020 A1* | 9/2010 | Sakata et al. .................... 257/43 |
| 2011/0163310 A1 | 7/2011 | Park et al. |
| 2011/0253998 A1 | 10/2011 | Theiss et al. |
| 2012/0171822 A1* | 7/2012 | Yuan et al. .................... 438/166 |
| 2013/0302939 A1 | 11/2013 | Liu et al. |

FOREIGN PATENT DOCUMENTS

| | | |
|---|---|---|
| CN | 102184865 A | 9/2011 |
| CN | 102651341 A | 8/2012 |
| JP | 2006-324368 A | 11/2006 |

OTHER PUBLICATIONS

First Chinese Office Action dated Aug. 5, 2013; Appln. No. 201210010351.1.
International Preliminary Report on Patentability dated Jul. 15, 2014; PCT/CN2012/086312.
Korean Office Action Appln. No. 10-2013-7019644; Dated Aug. 30, 2014 .
Korean Office Action dated May 14, 2015; Appln. No. 10-2013-7019644.
Extended European Search Report dated Oct. 9, 2015; Appln. No. 12861052.4-1504/2804207 PCT/CN2012086312.

* cited by examiner

MANUFACTURING METHOD OF TFT ARRAY SUBSTRATE

FIELD OF THE INVENTION

Embodiments of the present invention relate to a manufacturing method of a TFT array substrate.

BACKGROUND

At present, flat panel displays have been gradually replacing the bulky CRT displays. The common flat panel displays include liquid crystal displays (LCDs) and organic light emitting diode displays.

In the LCD, each pixel is driven by a corresponding thin film transistor (TFT) on a TFT array substrate and displays image in cooperation with peripheral driving circuits. In the active matrix organic light emission display (AMOLED), each pixel is driven by a corresponding thin film transistor (TFT) on a TFT array substrate and displays image in cooperation with peripheral driving circuits. In the above mentioned displays, the TFT functions as a switching element, and is a key element for achieving image display in the above mentioned displays. The characteristics of the TFT directly determine the development of high performance flat panel displays.

The TFTs that have been industrialized include amorphous silicon TFTs, polysilicon TFTs, monocrystalline silicon TFTs and the like. Among these TFTs, the amorphous silicon TFTs is mostly widely used to manufacture the array substrate of the flat panel display.

Recently, metal oxide TFTs draw more and more attentions. The metal oxide TFTs have the advantage of high carrier mobility so that they can be made very small, and in this case, the resolution of the flat panel display can be increased and the display effect can be improved. Furthermore, the metal oxide TFTs also have such advantages as less occurrence of characteristic unevenness, low cost of materials and processes, low temperature of processes, suitable to a coating process, high transparency, large band gap and the like.

The array substrate comprising the metal oxide TFT is generally manufactured by using six photolithographic processes. If the number of the photolithographic processes can be reduced, that is, if the number of the masks used in the manufacturing process can be reduced, it is possible to increase the production efficiency and reduce the production cost.

SUMMARY OF THE INVENTION

Embodiments of the present invention provide a manufacturing method of a TFT array substrate. The method includes the following steps: respectively forming a metal oxide semiconductor layer, an etching barrier layer, a source electrode, a data line, a drain electrode, a pixel electrode, a gate insulating layer, a contact hole, a gate electrode and a gate scanning line on a substrate by patterning processes, wherein the metal oxide semiconductor layer and the etching barrier layer are formed by a same patterning process, and the source electrode, the drain electrode, the pixel electrode and the data line are formed by another same patterning process.

In the manufacturing method according to the embodiments of embodiment, four patterning processes are used to manufacture the TFT array substrate. Compared with the conventional method using six patterning processes, the number of the patterning processes are reduced by two, thus the manufacturing process can be simplified, the production efficiency can be increased, and the production cost can be reduced.

BRIEF DESCRIPTION OF THE DRAWINGS

In order to clearly illustrate the technical solution of the embodiments of the invention, the drawings of the embodiments will be briefly described in the following; it is obvious that the described drawings are only related to some embodiments of the invention and thus are not limitative of the invention.

DESCRIPTION OF THE EMBODIMENTS

In order to make objects, technical solutions and advantages of the embodiments of the invention apparent, the technical solutions of the embodiment will be described in a clearly and fully understandable way in connection with the drawings related to the embodiments of the invention. It is obvious that the described embodiments are just a part but not all of the embodiments of the invention. Based on the described embodiments herein, those skilled in the art can obtain other embodiment(s), without any inventive work, which should be within the scope of the invention.

In the following description, patterning processes includes a photolithographic process and other processes used to form predetermined patterns, such as a printing process, an ink jetting process and the like. The photolithographic process includes such steps as exposing, developing, etching and the like.

The following description is made based on a single pixel unit, but other pixel units may be formed in the same manner.

Embodiments of the present invention provide a manufacturing method of a TFT array substrate. The manufacturing method of the TFT array substrate includes the following steps: respectively forming a metal oxide semiconductor layer, an etching barrier layer, a source electrode, a data line, a drain electrode, a pixel electrode, a gate insulating layer, a contact hole, a gate electrode and a gate scanning line on a substrate by patterning processes, wherein the metal oxide semiconductor layer and the etching barrier layer are formed by a same patterning process, and the source electrode, the drain electrode, the transparent pixel electrode and the data line are formed by another same patterning process.

The above manufacturing method may include the following steps:

Step S1): forming the metal oxide semiconductor layer and the etching barrier layer on the substrate by the same patterning process with a gray-tone or half-tone mask;

Step S2): forming the source electrode, the drain electrode, the data line and the pixel electrode on the substrate after the step S1) by the another same patterning process with a gray-tone or half-tone mask;

Step S3): forming the gate insulating layer on the substrate after the step S2), and forming the contact hole by a patterning process;

Step S4): forming the gate electrode and the gate scanning line on the substrate after the step S3) by a patterning process.

Embodiment 1

Figure 1:
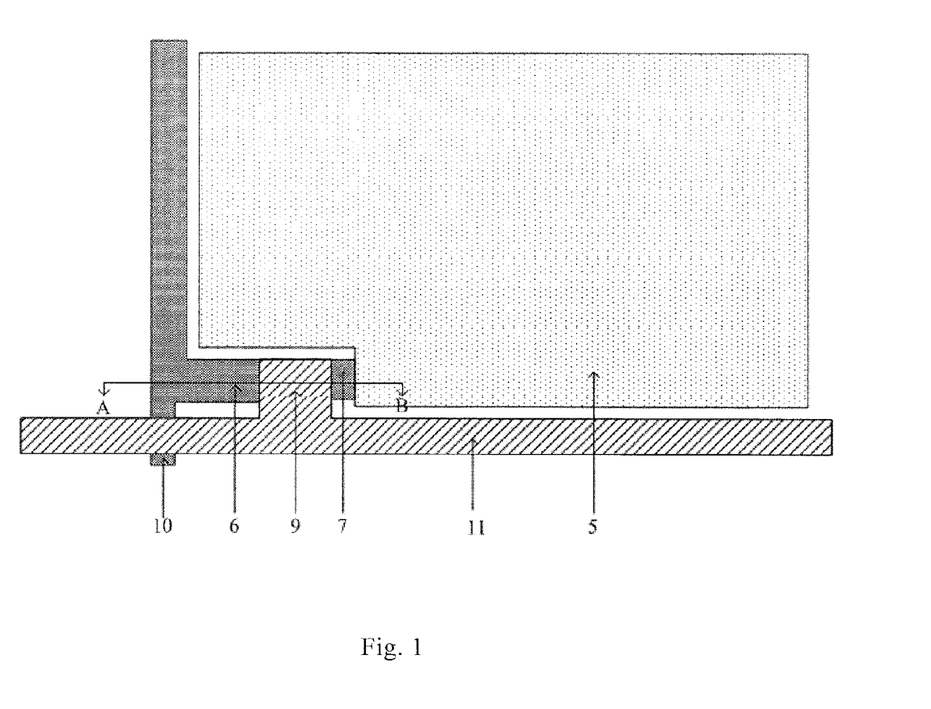
FIG. 1 is a schematic plan view showing a TFT array substrate manufactured by a manufacturing method of a TFT array substrate according to an embodiment of the present invention.

Shown in FIG. 1 is a plan view of a TFT array substrate manufactured by the manufacturing method according to this embodiment.

The TFT array substrate includes a plurality of gate scanning lines 11 and a plurality of data lines 10, the gate scanning lines 11 and the data lines 10 intersect with each other to define a plurality of pixel units arranged in a matrix. Each pixel unit includes a TFT that functions as a switching element and a pixel electrode 5 that uses to control the alignment of liquid crystal molecules.

The TFT of each pixel unit includes: a metal oxide semiconductor layer, functioning as an active layer; an etching barrier layer, formed on the metal oxide semiconductor layer; a source electrode, one end thereof provided on the metal oxide semiconductor layer; a drain electrode, one end thereof opposing to the source electrode and provided on the metal oxide semiconductor layer; a gate insulating layer, formed to cover the source electrode, the drain electrode and the etching barrier layer; and a gate electrode, formed on the gate insulating layer and located above the metal oxide semiconductor layer. In the TFT, the gate electrode is electrically connected with the corresponding gate scanning line, the source electrode is electrically connected with the corresponding data line, and the drain electrode is electrically connected with the pixel electrode.

FIGS. 2-5 are sectional views taken along the line A-B in FIG. 1. Hereinafter, the manufacturing method of the TFT array substrate according to this embodiment will be described in detail in connection with FIGS. 2-5.

In this embodiment, the manufacturing method of the TFT array substrate includes the following steps.

Figure 2A:
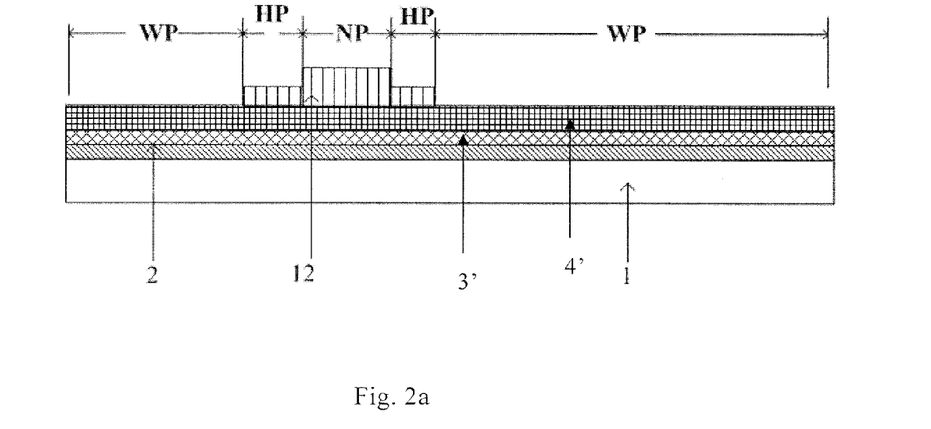
FIGS. 2a-2e are schematic cross-sectional views showing the TFT array substrate during a first patterning process in the manufacturing method of the TFT array substrate according to the embodiment of the present invention.
Figure 2B:
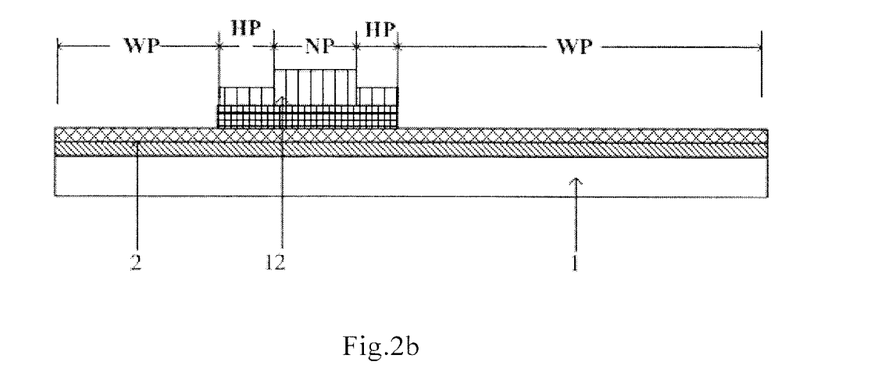
Figure 2C:
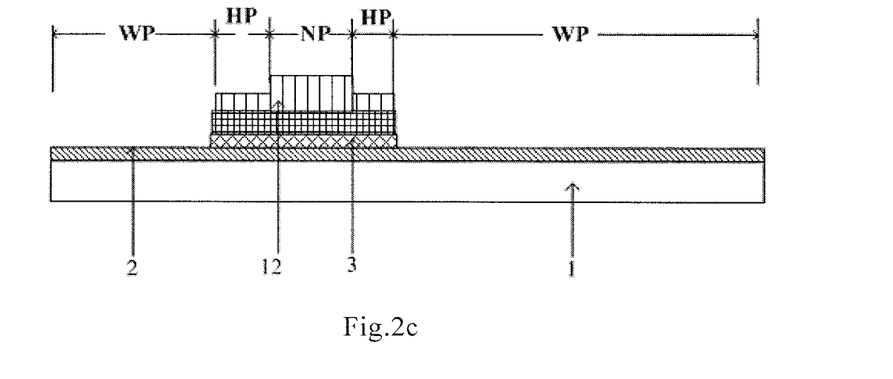
Figure 2D:
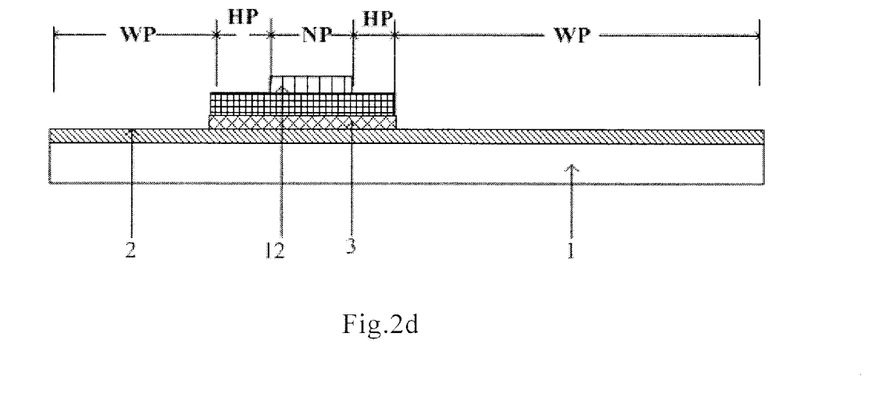
Figure 2E:
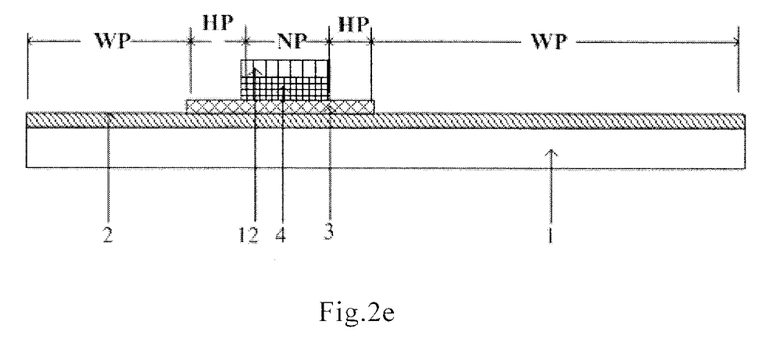
Figure 2F:
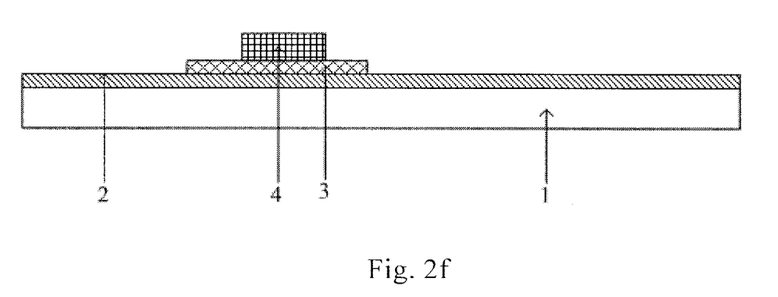
FIG. 2f is a schematic cross-sectional view showing the TFT array substrate after the first patterning process in the manufacturing method of the TFT array substrate according to the embodiment of the present invention.

Step S1): forming the metal oxide semiconductor layer 3 and the etching barrier layer 4 on a substrate by a patterning process with a gray-tone or half-tone mask, as shown in FIG. 2f.

First, a modification layer 2 is deposited on the substrate 1, and then a metal oxide semiconductor film 3' and an etching barrier film 4' are deposited in this order on the modification layer 2. The etching barrier layer 4 and the metal oxide semiconductor layer 3 are formed by the patterning process using the gray-tone or half-tone mask.

For example, the step S1) may include the following steps.

S11) depositing the modification layer 2, the metal oxide semiconductor film 3' and the etching barrier film 4' in this order on the substrate 1.

S12) coating a layer of photoresist 12 on the substrate 1 after the step S11).

S13) performing exposing and developing processes on the photoresist by using the gray-tone or half-tone mask. A non-transmissive region, a partially-transmissive region and a transmissive region are provided in the half-tone or gray-tone mask. If the photoresist 12 is a positive photoresist, the non-transmissive region, the partially-transmissive region and the transmissive region in the gray-tone or half-tone mask respectively correspond to a photoresist completely retained region NP, a photoresist partially retained region HP and a photoresist completely removed region WP after the exposing and the developing processes of the photoresist. If the photoresist 12 is a negative photoresist, the non-transmissive region, the partially-transmissive region and the transmissive region in the gray-tone or half-tone mask respectively correspond to a photoresist completely removed region WP, a photoresist partially retained region HP and a photoresist completely retained region NP after the exposing and the developing processes of the photoresist. The photoresist of the photoresist completely retained region NP is completely retained, and the photoresist completely retained region NP corresponds to the region for forming the etching barrier layer. The thickness of the photoresist of the photoresist partially retained region HP is thinner than the thickness of the photoresist of the photoresist completely retained region NP, and the photoresist partially retained region corresponds to the region for forming the metal oxide semiconductor layer. The photoresist of the photoresist completely removed region WP is completely removed, and the regions which are not covered by the photoresist are all photoresist completely removed region WP, as shown in FIG. 2a.

The principle of forming the photoresist partially retained region HP is as follows. This region is exposed by using the partially-transmissive region with slits in the gray-tone or half-tone mask. Whether the photoresist 12 is a positive photoresist or a negative photoresist, the diffraction effect and the interference effect of the slits allow the intensity of the light reaching this region upon performing the exposing process to be weaker than the intensity of the light of the transmissive region. Therefore, the photoresist of the partially-transmissive region is less exposed than the photoresist of the transmissive region, so that the thickness of the photoresist of the photoresist partially retained region HP is thinner than the thickness of the photoresist of the photoresist completely retained region NP.

S14) performing an etching process after the step S13), so as to form the metal oxide semiconductor layer 3.

As shown in FIG. 2b, a first etching process is performed by using a dry etching method, so as to etch away the etching barrier film of the photoresist completely removed region WP. As shown in FIG. 2c, a second etching process is performed by using a wet etching method, so as to etch away the metal oxide semiconductor film of the photoresist completely removed region WP. Thereby, the metal oxide semiconductor layer 3 is formed.

S15) performing an ashing treatment after the step S14), so as to remove the photoresist of the photoresist partially retained region, as shown in FIG. 2d.

S16) performing an etching process after the step S15), so as to form the etching barrier layer.

As shown in FIG. 2e, a third etching process is performed by using a dry etching method, so as to etch away the etching barrier film of the photoresist partially retained region HP. Thereby, the etching barrier layer 4 is formed.

S17) peeling off the remaining photoresist to expose the metal oxide semiconductor layer 3 and the etching barrier layer 4, as shown in FIG. 2f.

In the above-mentioned steps, the deposition of the modification layer 2 on the substrate 1 may be performed continuously by using a Plasma Enhanced Chemical Vapor Deposition (PECVD) method, and the thickness of the modification layer 2 may be in a range of 500 to 2000 Å. The modification layer 2 may be formed of silicon oxide $SiO_x$, silicon nitride $SiN_x$, silicon oxynitride $SiN_xO_y$, or may be formed of an insulating metal oxide such as $Al_2O_3$. When using the PECVD method, the reacting gases used to form the silicon nitride may be $SiH_4$, $NH_3$ and $N_2$ or may be $SiH_2Cl_2$, $NH_3$ and $N_2$, the reacting gases used to form the silicon oxide may be $SiH_4$ and $N_2O$, and the reacting gases used to form the silicon oxynitride may be $SiH_4$, $N_2O$, $NH_3$ and $N_2$. The modification layer 2 allows the posterior metal oxide semiconductor layer to well form on the substrate 1, and thus the metal oxide semiconductor layer 3 can be protected and the stability of the metal oxide semiconductor layer 3 can be improved.

The deposition of the metal oxide semiconductor film 3' on the substrate 1 may be performed by using a sputtering method or a thermal evaporation method. The thickness of the metal oxide semiconductor film may be 100-4000 Å. The metal oxide semiconductor film may be made of an amorphous IGZO, or may be made of HIZO, IZO, a-InZnO, a-InZnO, ZnO:F, $In_2O_3$:Sn, $In_2O_3$:Mo, $Cd_2SnO_4$, ZnO:Al, $TiO_2$:Nb, Cd—Sn—O or other metal oxides.

The deposition of the etching barrier film 4' may be performed by using a PECVD method, and the thickness of the etching barrier film may be 500-4000 Å. The etching barrier film may be formed of silicon oxide $SiO_x$, silicon nitride $SiN_x$, silicon oxynitride $SiN_xO_y$, or may be formed of an insulating metal oxide such as $Al_2O_3$. When using the PECVD method, the reacting gases used to form the silicon nitride may be $SiH_4$, $NH_3$ and $N_2$ or may be $SiH_2Cl_2$, $NH_3$ and $N_2$, the reacting gases used to form the silicon oxide may be $SiH_4$ and $N_2O$, and the reacting gases used to form the silicon oxynitride may be $SiH_4$, $N_2O$, $NH_3$ and $N_2$.

Figure 3A:
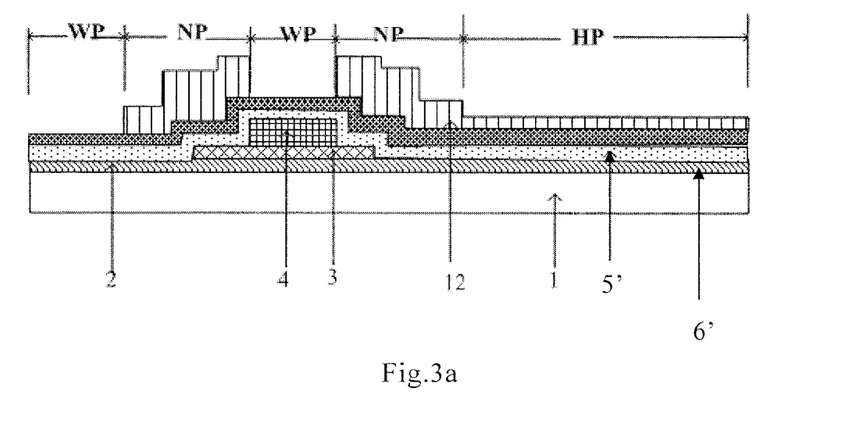
FIGS. 3a-3e are schematic cross-sectional views showing the TFT array substrate during a second patterning process in the manufacturing method of the TFT array substrate according to the embodiment of the present invention.
Figure 3B:
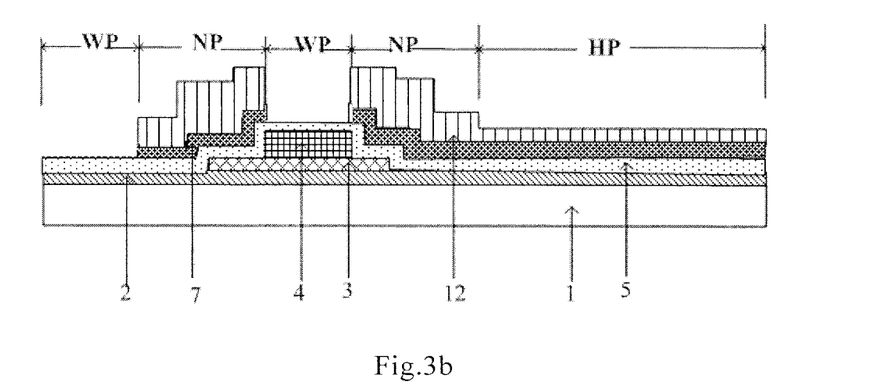
Figure 3C:
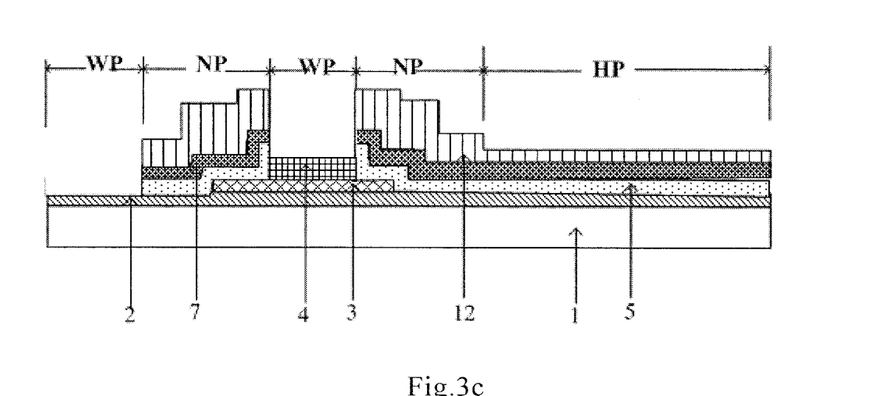
Figure 3D:
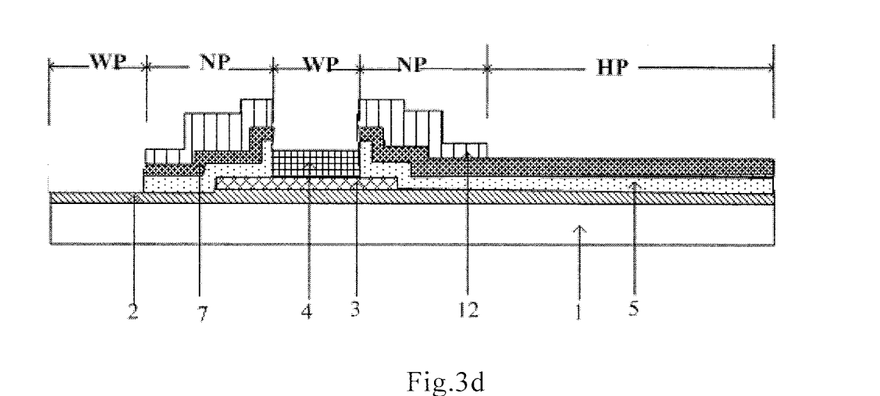
Figure 3E:
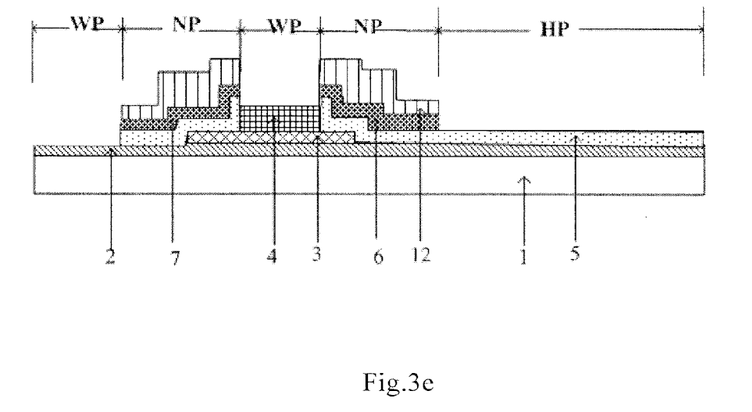
Figure 3F:
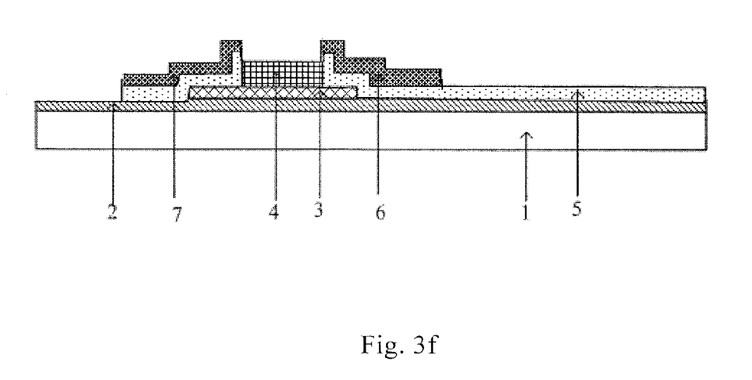
FIG. 3f is a schematic cross-sectional view showing the TFT array substrate after the second patterning process in the manufacturing method of the TFT array substrate according to the embodiment of the present invention.

Step S2): forming the drain electrode 6, the source electrode 7, the data line (not shown in FIG. 3) and the transparent pixel electrode 5 on the substrate 1 after the step S1) by a patterning process with a gray-tone or half-tone mask, as shown in FIG. 3f.

The step S2) may include the following steps.

S21) depositing a transparent conductive film 5' and a source/drain metal film 6' in this order on the substrate 1.

S22) coating a layer of photoresist 12 on the substrate 1 after the step S21).

S23) performing exposing and developing processes on the photoresist 12 by using the gray-tone or half-tone mask. A non-transmissive region, a partially-transmissive region and a transmissive region are provided in the half-tone or gray-tone mask. If the photoresist 12 is a positive photoresist, the non-transmissive region, the partially-transmissive region and the transmissive region in the gray-tone or half-tone mask respectively correspond to a photoresist completely retained region NP, a photoresist partially retained region HP and a photoresist completely removed region WP after the exposing and the developing processes of the photoresist. If the photoresist 12 is a negative photoresist, the non-transmissive region, the partially-transmissive region and the transmissive region in the gray-tone or half-tone mask respectively correspond to a photoresist completely removed region WP, a photoresist partially retained region HP and a photoresist completely retained region NP after the exposing and the developing processes of the photoresist. The photoresist completely retained region NP corresponds to the region to form the data lines, the source electrode and the drain electrode, the photoresist partially retained region HP corresponds to the region to form the transparent pixel electrode, and the regions which are not covered by the photoresist are all photoresist completely removed regions WP, as shown in FIG. 3a.

S24) performing an etching process after the step S23), so as to form the source electrode 7 and the data lines.

As shown in FIG. 3b, a first etching process is performed to etch away the source/drain metal film 6' of the photoresist completely removed region WP. As shown in FIG. 3c, a second etching process is performed to etch away the transparent conductive film 5' of the photoresist completely removed region WP. Thereby, the source electrode 7 and the data lines (not shown in the figure) are formed.

S25) performing an ashing treatment after the step S24), so as to remove the photoresist of the photoresist partially retained region HP, as shown in FIG. 3d.

S26) performing an etching process after the step S25), so as to form the drain electrode 6 and the transparent pixel electrode 5.

As shown in FIG. 3e, a third etching process is performed to etch away the source/drain metal film 6' of the photoresist partially retained region HP. Thereby, the drain electrode 6 and the transparent pixel electrode 5 are formed.

S27) peeling off the remaining photoresist to expose the drain electrode 6, the source electrode 7, the transparent pixel electrode 5 and the data lines.

Since the modification layer 2 is deposited on the substrate in the step S1), a TFT channel formed between the drain electrode 6 and the source electrode 7 can be effectively protected by the modification layer 2 upon performing the deposition of the transparent conductive film in the above mentioned steps, and thus the direct contact between the TFT channel and the substrate 1 which otherwise will form a bad interface can be avoided. Meanwhile, by employing the modification layer 2, the metal oxide semiconductor layer formed in the first patterning process of the step S1) can be more stable to avoid defects.

In this embodiment, since the metal oxide semiconductor layer is formed of the metal oxide semiconductor with wide band gap such as IGZO, photocurrent will not occur when the metal oxide semiconductor layer is irradiated by the visible light. Therefore, a light shielding layer is not used in this embodiment, and the modification layer is formed on the substrate directly.

In the above mentioned steps, the transparent conductive film may be deposited by a sputtering method or a thermal evaporation method after the step S1), and the thickness of the transparent conductive film may be 300-1500 Å. The thickness of the source/drain metal film may be 2000-3000 Å. The transparent conductive film may be made of ITO, or may be made of other metals and metal oxides. The source/drain metal film may be made of a sing layer formed by any one of Cr, W, Ti, Ta, Mo, Al and Cu, or may be made of alloys of any one of the above-mentioned metals, or may be made of a multi-layer formed of any combination of the above-mentioned metals.

Figure 4:
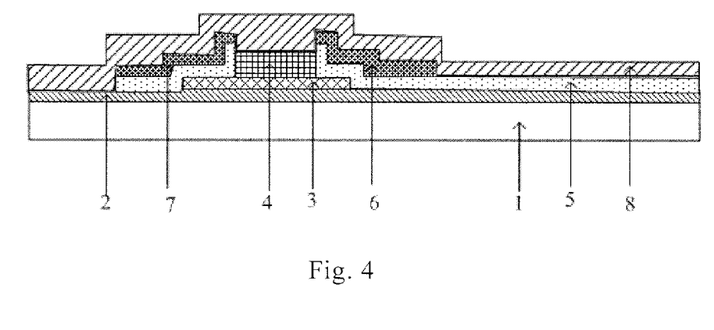
FIG. 4 is a schematic cross-sectional view showing the TFT array substrate after a third patterning process in the manufacturing method of the TFT array substrate according to the embodiment of the present invention.

Step S3): forming a gate insulating layer 8 on the substrate 1 after the step S2), and forming a contact hole (not shown) by a patterning process, as shown in FIG. 4.

In this step, the gate insulating layer 8 is deposited on the substrate 1 after the step S2), and the contact hole is formed by a photolithographic process.

In this step, the deposition of the gate insulating layer 8 may be continuously performed by a PECVD method, and the thickness of the gate insulating layer 8 may be 1000-4000 Å. The gate insulating layer 8 may be formed of silicon oxide $SiO_x$, silicon nitride $SiN_x$, silicon oxynitride $SiN_xO_y$, or may be formed of an insulating metal oxide such as $Al_2O_3$. When using the PECVD method, the reacting gases used to form the silicon nitride may be $SiH_4$, $NH_3$ and $N_2$, or may be $SiH_2Cl_2$, $NH_3$ and $N_2$, the reacting gases used to form the silicon oxide may be $SiH_4$ and $N_2O$, and the reacting gases used to form the silicon oxynitride may be $SiH_4$, $N_2O$, $NH_3$ and $N_2$.

Step S4): forming the gate electrode and the gate scanning line on the substrate 1 after the step S3) by a patterning process.

Figure 5:
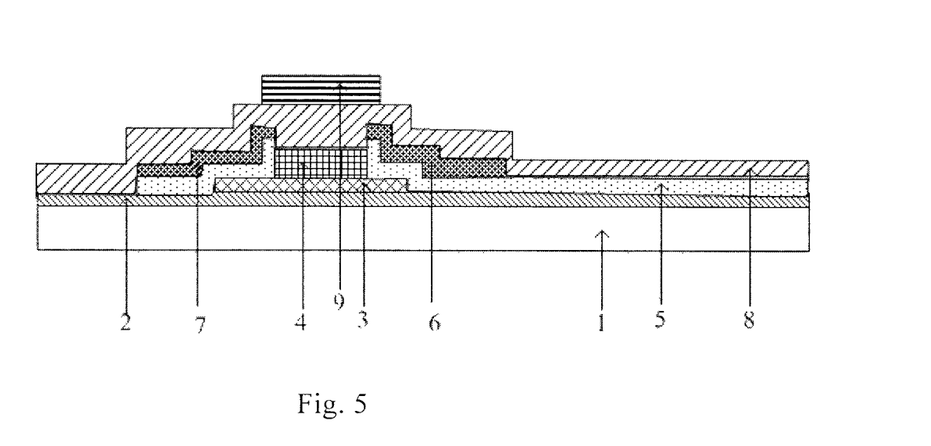
FIG. 5 is a schematic cross-sectional view showing the TFT array substrate after a fourth patterning process in the manufacturing method of the TFT array substrate according to the embodiment of the present invention.

In this step, a gate metal film is deposited on the substrate 1 after the step S3), and the gate electrode 9 and the gate scanning line 11 are formed by a photolithographic process.

In this step, the gate metal film may be deposited by a sputtering method or a thermal evaporation method, and the thickness of the gate metal film may be 4000-15000 Å. The gate metal film may be made of a single layer formed by any one of Cr, W, Cu, Ti, Ta, and Mo, or may be made of alloys of any one of the above-mentioned metals, or may be made of a multi-layer formed by any combination of the above-mentioned metals. Next, the gate electrode 9 and the gate scanning line 11 are formed by a photolithographic process, as shown in FIG. 5.

Embodiment 2

The difference of this embodiment from the above embodiment 1 is in that the etching barrier layer 4 may use a lamination structure.

In this embodiment, the etching barrier layer 4 uses a dual-layer structure. In the dual-layer structure of the etching barrier layer 4, the layer contacting the metal oxide semiconductor layer 3 is made of $SiO_2$ and is formed by a low speed deposition manner, and the layer away from the metal oxide semiconductor layer 3 is made of $SiN_x$ and is formed by a high speed deposition manner.

In the above descriptions, the TFT is a top gate type TFT. However, the embodiments of the present invention are applicable to manufacture an array substrate having a metal oxide TFT of bottom gate type as well. When the TFT is of bottom gate type, the gate insulating layer 8 may also have a lamination structure in addition to the etching barrier layer 4. For example, the gate insulating layer 8 may have a dual-layer structure. In the dual-layer structure of the gate insulating layer 8, the layer contacting the metal oxide semiconductor layer 3 is made of $SiO_2$ and is formed by a low speed deposition manner, whereas the layer away from the metal oxide semiconductor layer 3 is made of $SiN_x$ and is formed by a high speed deposition manner.

According to this embodiment, since the portions of the etching barrier layer and the gate insulating layer that contact the metal oxide semiconductor layer are formed by a low speed deposition manner, these portions are more compact, and thus a good interface can be formed between these portions and the metal oxide semiconductor layer 3, which is advantageous in increasing the stability of the TFT. On the other hand, since the portions of the etching barrier layer and the gate insulating layer that are away from the metal oxide semiconductor layer 3 are formed by a high speed deposition manner, the depositing speed is relatively fast, and thus the production efficiency can be effectively increased.

The embodiments of the present invention provide the manufacturing method of the array substrate with metal oxide TFT by four patterning processes. Compared with the conventional method using six patterning processes, the number of the patterning processes is reduced by two, thus the manufacturing method can be simplified, the production efficiency can be increased and the production cost can be reduced. The embodiments of the present invention are especially suitable for the TFT-LCD with large size and high resolution and the AMOLED.

The embodiments described above are only exemplary implementation of the present invention, and are not used to limit the protection scope of the present invention, which is defined by the appended claims.

What is claimed is:

1. A manufacturing method of a TFT array substrate, including the following steps: respectively forming a metal oxide semiconductor layer, an etching barrier layer, a source electrode, a data line, a drain electrode, a pixel electrode, a gate insulating layer, a contact hole, a gate electrode and a gate scanning line on a substrate by patterning processes, wherein the metal oxide semiconductor layer and the etching barrier layer are formed by a same patterning process, and the source electrode, the drain electrode, the pixel electrode and the data line are formed by another same patterning process;

wherein the etching barrier layer has a dual-layer structure; and wherein in the dual-layer structure of the etching barrier layer, a layer contacting the metal oxide semiconductor layer is made of $SiO_2$ and is formed by a low speed deposition manner, whereas a layer away from the metal oxide semiconductor layer is made of $SiN_x$ and is formed by a high speed deposition manner.

2. The manufacturing method according to claim 1, wherein the manufacturing method includes the following steps:

Step S1): forming the metal oxide semiconductor layer and the etching barrier layer on the substrate by the same patterning process with a gray-tone or half-tone mask;

Step S2): forming the source electrode, the drain electrode, the data line and the pixel electrode on the substrate after the step S1) by the another same patterning process with a gray-tone or half-tone mask;

Step S3): forming the gate insulating layer on the substrate after the step S2), and forming the contact hole by a patterning process; and Step S4): forming the gate electrode and the gate scanning line on the substrate after the step S3) by a patterning process.

3. The manufacturing method according to claim 2, wherein the step S1) includes the following steps:

S11) depositing a metal oxide semiconductor film and an etching barrier film in this order on the substrate;

S12) coating a layer of photoresist on the substrate after the step S11);

S13) using a gray-tone or half-tone mask to perform exposing and developing processes on the photoresist so as to form a photoresist completely retained region, a photoresist partially retained region and photoresist completely removed regions, the photoresist completely retained region corresponding to a region for forming the etching barrier layer, the photoresist partially retained region corresponding to a region for forming the metal oxide semiconductor layer, and regions not covered by the photoresist corresponding to the photoresist completely removed region;

S14) performing an etching process after the step S13) so as to form the metal oxide semiconductor layer;

S15) performing an ashing treatment after the step S14) so as to remove the photoresist of the photoresist partially retained region;

S16) performing an etching process after the step S15) so as to form the etching barrier layer; and S17) peeling off a remaining portion of the photoresist.

4. The manufacturing method according to claim 3, wherein in the step S11), a modification layer is firstly deposited on the substrate and then the metal oxide semiconductor film and the etching barrier film are deposited in this order on the modification layer;
the deposition of the modification layer is performed by a PECVD method; and
the modification layer is made of an oxide, a nitride or a oxynitride compound, and a thickness of the modification layer is in a range of 500-2000 Å.

5. The manufacturing method according to claim 3, wherein in the step S11), the deposition of the metal oxide semiconductor film is performed by a sputtering method or a thermal evaporation method, the metal oxide semiconductor film is made of amorphous IGZO, HIZO, IZO, a-InZnO, ZnO:F, $In_2O_3$:Sn, $In_2O_3$:Mo, $Cd_2SnO_4$, ZnO:Al, $TiO_2$:Nb or Cd—Sn—O, a thickness of the metal oxide semiconductor film is 100-2000 Å; and
the deposition of the etching barrier film on the metal oxide semiconductor film is performed by a PECVD method, the etching barrier film is made of silicon oxide, silicon nitride or silicon oxynitride, and a thickness of the etching barrier film is 500-4000 Å.

6. The manufacturing method according to claim 2, wherein the step S2) includes the following steps:

S21) depositing a transparent conductive film and a source/drain metal film in this order on the substrate;

S22) coating a layer of photoresist on the substrate after the step S21);

S23) using a gray-tone or half-tone mask to perform exposing and developing processes on the photoresist so as to form a photoresist completely retained region, a photoresist partially retained region and photoresist completely removed regions, the photoresist completely retained region corresponding to regions for forming the data line, the source electrode and the drain electrode, the photoresist partially retained region corresponding to a region for forming the pixel electrode, and regions not covered by the photoresist corresponding to the photoresist completely removed regions;

S24) performing an etching process after the step S23) so as to form the source electrode and the data line;

S25) performing an ashing treatment after the step S24) so as to remove the photoresist of the photoresist partially retained region;

S26) performing an etching process after the step S25) so as to form the drain electrode and the pixel electrode; and S27) peeling off a remaining portion of the photoresist.

7. The manufacturing method according to claim 6, wherein in the step S21), the deposition of the transparent conductive film is performed by a sputtering method or a thermal evaporation method, the transparent conductive film is made of ITO or other transparent metal oxides, a thickness of the transparent conductive film is 300-1500 Å; and
the deposition of the source/drain metal film is performed by a sputtering method or a thermal evaporation method, the source/drain metal film is made of Cr, W, Ti, Ta, Mo, Al, Cu or an alloy of any one of these metals, and a thickness of the source/drain metal film is 2000-3000 Å.

8. The manufacturing method according to claim 2, wherein in the step S3), the gate insulating layer is formed by a PECVD method after the step S2), the gate insulating layer is made of an oxide, a nitride or a oxynitride compound, and a thickness of the gate insulating layer is 1000-4000 Å.

9. The manufacturing method according to claim 2, wherein in the step S4), a gate metal film is deposited on the gate insulating layer, and the gate electrode and the gate scanning line are formed by a photolithographic process;
the deposition of the gate metal film on the gate insulating layer is performed by a sputtering method or a thermal evaporation method, the gate metal film is made of Cr, W, Cu, Ti, Ta, Mo or an alloy of any one of these metals, and a thickness of the gate metal film is 4000-15000 Å.

10. The manufacturing method according to claim 1, wherein the TFT includes: the metal oxide semiconductor layer, functioning as an active layer; the etching barrier layer, formed on the metal oxide semiconductor layer; the source electrode, one end thereof provided on the metal oxide semiconductor layer; the drain electrode, one end thereof opposing to the source electrode and provided on the metal oxide semiconductor layer; the gate insulating layer, formed to cover the source electrode, the drain electrode and the etching barrier layer; and the gate electrode, formed on the gate insulating layer and located above the metal oxide semiconductor layer.

\* \* \* \* \*